March 19, 1963 F. A. HERRMANN 3,082,380

TRANSISTOR AMPLIFIER STAGE WITH HIGH INPUT IMPEDANCE

Filed July 13, 1961 3 Sheets-Sheet 1

INVENTOR.
Frank A. Herrmann

BY

Ostrolenk, Faber, Gerb & Soffen

ATTORNEYS.

March 19, 1963 F. A. HERRMANN 3,082,380

TRANSISTOR AMPLIFIER STAGE WITH HIGH INPUT IMPEDANCE

Filed July 13, 1961 3 Sheets-Sheet 2

INVENTOR.
Frank A. Herrmann

BY

Ostrolenk, Faber, Gerb & Soffen

ATTORNEYS

TRANSISTOR AMPLIFIER STAGE WITH HIGH INPUT IMPEDANCE

Filed July 13, 1961 3 Sheets-Sheet 3

INVENTOR.
FRANK A. HERRMANN

BY
OSTROLENK, FABER, GERB & SOFFEN

ATTORNEYS

United States Patent Office 3,082,380

Patented Mar. 19, 1963

3,082,380

TRANSISTOR AMPLIFIER STAGE WITH HIGH INPUT IMPEDANCE

Frank A. Herrmann, White Plains, N.Y., assignor to Sonotone Corporation, Elmsford, N.Y., a corporation of New York Filed July 13, 1961, Ser. No. 123,779

4 Claims. (Cl. 330—18)

This case is a continuation-in-part of my copending application Serial No. 825,087 filed July 6, 1959, now abandoned relating to transistor amplifiers, and more particularly to transistor amplifiers having an amplifier stage which has to operate with a high input impedance, while keeping the direct current resistance thereof low. As an example, a transistor amplifier stage for amplifying the output of a ceramic transducer such as a ceramic microphone or ceramic phonograph pick-up has to present to the ceramic transducer a high alternating-current input impedance. In the past, choke coils or transformers have been used in the input circuit of such transistor amplifier stage for providing the input circuit thereof with the required alternating-current impedance. However, choke coils have undesired characteristics such as bulkiness, limited frequency response, and susceptibility to disturbing magnetic leakage fields. There have also been available special transistorized feedback circuits whereby the output of a second amplifying transistor is fed back in special phase relation to the input circuit of the first amplifying transistor for increasing the input impedance. However, such circuits have characteristics which limit their application.

An object of the invention is a transistor amplifier stage having the desired high alternating-current input impedance without having to resort to choke coils and the like, and without the limitations of prior transistor circuits. In accordance with the invention, a transistor amplifier stage which has to operate with a high alternating-current input impedance has connected in the input circuit of the transistor amplifier thereof an auxiliary load transistor in such a way as to provide the input circuit of the amplifying transistor with the desired high alternating-current impedance, without materially increasing the direct-current resistance thereof.

The foregoing and other objects of the invention will be best understood from the following description of exemplifications thereof, reference being had to the accompanying drawing, wherein.

Figure 1:
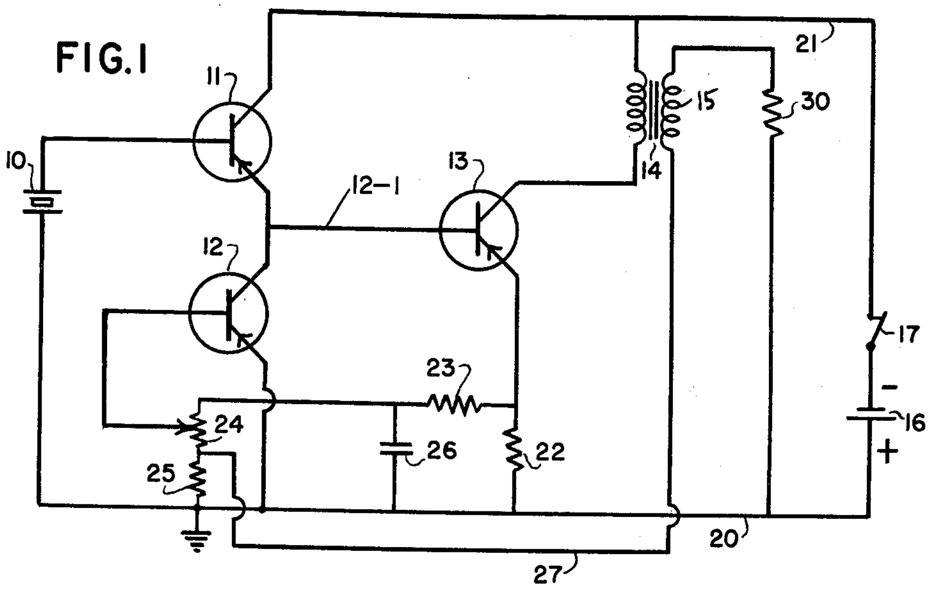
FIG. 1 is a circuit diagram of a simple transistor amplifier circuit exemplifying the invention.

FIG. 1 shows a simple audio-amplifier circuit for amplifying the output of a ceramic transducer such as the ceramic microphone 10, and delivering the amplified transducer signals to a load 30 of relatively low impedance or resistance, such as 250 ohms. The amplifier circuit has an input or first amplifier stage operating with transistor 11 and a generally passive auxiliary series transistor 12. The signal output developed across the emitter and collector circuit of series transistor 12 is impressed on a second or output amplifier stage operating with a transistor 13 which delivers its amplified signal output through a transformer 14 to a low-resistance load 30. In the specific circuit shown, all transistors are junction transistors of the same type of conductivity, and they are PNP transistors. Obviously, the transistors may be of opposite conductivity, in which case the polarity of the direct-current power source and of the electric capacitors of the circuit will be reversed. The circuits of all transistor amplifier stages are energized from a common direct-current power supply, indicated by a single battery 16 which may be disconnected from the circuits by a switch 17.

In accordance with the invention, the alternating-current input impedance of the first-stage transistor is given a very high value by connecting in series with its emitter circuit the output electrodes of an auxiliary load transistor. In the specific example of FIG. 1, the collector and emitter of the series transistor 12 are serially connected with the collector and emitter of first-stage amplifying transistor 11 between the direct-current supply leads 20, 21 from the opposite-polarity terminals of the direct-current source 16. The high-impedance signal input source, represented by ceramic microphone 10, is connected between the base of first-stage transistor 11 and direct-current supply lead 20, to which the emitter of the series transistor 12 is connected. The amplified signal output of the first transistor 11 is developed across the collector and emitter of the series transistor 12 and is delivered through lead 12–1 from the collector of series transistor 12 to the base of second-stage transistor 13, and the ground connection 20 between their emitters.

In the example shown, the positive pole of the direct-current power source 16 is connected through a current lead, indicated as grounded supply lead 20, to the emitter of the series transistor 12, the opposite or negative pole of the direct-current supply source 16 being connected through the opposite pole supply lead 21 to the collector of the first-stage transistor 11 and by way of its emitter to the collector of the series transistor 12. The series connection between the emitter of the first-stage transistor 11 and the collector of series transistor 12, is connected through their common-connection lead 12–1 to the base of the second-stage transistor 13 for impressing on its input terminals the amplified output of transistor 11 which is developed across the collector and emitter of its series transistor 12. The emitter of the second-stage transistor 13 is connected through an emitter resistance 22 to the grounded supply lead 20 of the direct-current supply source, and the collector of this transistor 13 is connected through the primary winding of the output transformer 14 to the opposite-polarity direct-current supply lead 21. The transformer has a secondary winding 15 which delivers the amplified output current to the desired load, shown by way of example, as a lead resistance 30.

Proper direct-current bias and supply voltages are provided by a bias circuit consisting of serially connected resistance 23, potentiometer resistance 24 and resistance 25, which are connected in parallel across the emitter resistance 22 of the second-stage transistor 13, and connecting the base of the series transistor 12 to the variable tap of potentiometer resistance 24, an electrolytic bypass capacitor 26 being connected across the two resistances 22, 23.

By way of example, there are now given specific data on the effect of the series transistor 12 in increasing the alternating current impedance of the input circuit of first-stage transistor 11, without increasing its direct-current resistance. Assuming conventional junction transistors 11 and 12, the emitter to collector circuit of series transistor 12 has alternating-current resistance of the order of 50,000 ohms, and has a direct-current resistance of only about 3,000 ohms. Since the high alternating-current resistance of the collector-emitter circuit of series transistor 12 is connected in the emitter circuit of the first-stage transistor 11, the alternating-current input impedance of transistor 11 is approximately equal to the product of the alternating-current resistance of its emitter circuit and of its current gain. With available transistors having current gain of the order of 200, the input circuit of transistor 11 will be given an input impedance of the order of 6 megohms by connecting in series with the emitter input circuit thereof, the collector-emitter circuit of series transistor 12.

To avoid shunting of the input circuit of first-stage transistor 11 with biasing resistors, the input electrodes of transistor 11 are self-biased, the direct-current bias thereof being dependent on its saturated reverse collector current or $I_{CO}$. Although this makes the emitter direct current of transistor 11 sensitive to temperature changes, it has been found that undesirable effects caused by an increase in the emitter direct current of the first-stage transistor 11 due to temperature change, are overcome by producing a corresponding increase of the emitter direct current of its series transistor 12. As a result, irrespective of temperature changes, the emitter direct currents of the two transistors 11, 12 are maintained in a desired predetermined relation, and the common connection lead 12–1 from the emitter and collector of transistors 11, 12, respectively, applies proper direct-current bias to the base of the second-stage transistor 12. Such bias regulation is achieved by the shown circuit connections of the base and emitter of series transistor 12 to the circuit of the resistance elements 23, 24, 25, which are connected across emitter resistance 22 of the second-stage transistor 13. With this arrangement, a change in the emitter direct current of transistor 11 due to temperature change, is accompanied by a similar change in the emitter current of series transistor 12. Thus, as an example, an increase in emitter direct current in transistor 11 increases the bias applied to the base of second-stage transistor 13, which increases its emitter direct current and produces a corresponding increased voltage drop across its emitter resistance 22, thereby increasing the direct current flowing through resistances 23, 24, 25 to the base of series transistor 12, and thereby producing a corresponding increase of its base direct current. Once the direct-current bias applied to the series transistor 12 is adjusted by the tap of potentiometer resistance 24 for proper operation of the amplifier circuit shown, the amplifier will operate satisfactorily over a wide range of changes in the ambient temperature. An amplifier circuit of the type shown may be readily designed for operation with a frequency response which is flat within ±1.5 db over the frequency range from 50 cycles to 20 kilocycles per second.

In order to supply the amplified output to a load having a relatively low resistance, the output of the amplifier is supplied to such load 30 through a transformer 14 having a ferromagnetic core and a secondary winding 15 which is connected to the load 30. An amplifier of the type described having an iron core output transformer has a peaked response which drops both at the low frequency end and high frequency end of the frequency range. In accordance with a phase of the invention, the secondary winding 15 of the output transformer 14 is connected through a current feed-back lead 27 to the input side of a previous amplifying stage for feeding back thereto transformer output current of such amplitude and phase characteristics as to cause the peaked response over the intermediate part of the frequency range to be lowered and to cause the drooping response at the low frequency and high frequency of the frequency range to be raised for assuring that the over-all response of the amplifier circuit is substantially flat from low frequencies such as 50 c.p.s. up to 20,000 c.p.s. By way of example an amplifier of the invention of the type described above, in connection with FIG. 1, and having an additional amplification stage such as described in connection with FIG. 2, which supplies the amplified output to a load 30 through a transformer—but without the feedback of the invention—has a peaked response over the intermediate frequency range with the response at 50 cycles per second being about 20 db below the peaked response, and with a response at 20,000 c.p.s. more than 10 db below the peaked response. In accordance with the invention, by feeding current from the transformer secondary winding back to the input stage of such amplifier, the response thereof was rendered flat over the entire frequency range from 50 c.p.s. up to 20,000 c.p.s., with the flat response being only about 8 db below the highest peak of the original peaked response.

In the specific circuit of the invention shown in FIG. 1, the secondary winding 15 of the output transformer 14 is connected through the current feedback lead 27 to an intermediate portion of the two serially-connected resistance elements 24, 25 which form part of the input circuit of the transistor amplifier 11 of the first amplifier stage, whereby the response of the amplifier is rendered flat over the entire desired frequency range from 50 c.p.s. to 20,000 c.p.s.

In the over-all operation of the amplifier of FIG. 1, the signal output of ceramic transducer 10 is impressed between the base and emitter of first-stage transistor 11. The amplified output of first-stage transistor 11 developed across the collector and emitter of its series transistor 12 is impressed through lead 12–1 and ground lead 20 between the base and emitter of second-stage transistor 13. The amplified output of second-stage transistor 13 is delivered through transformer 14 to the load 30. As explained, a portion of the output current of proper amplitude and phase is fed back from secondary winding 15 of transformer 14 through a feedback lead 27 to an intermediate point of the serially-connected resistance elements 24, 25, so that a current component of proper amplitude and phase is applied by the variable tap of potentiometer resistance 24 to the base of series transistor 12 of the input circuit of first amplifier stage transistor 11 for providing negative feedback action over the intermediate part of the desired frequency range, such as 50 c.p.s. to 20,000 c.p.s., and positive feedback action over the low and high frequency parts thereof, and securing a flat response over the entire desired frequency range.

Figure 2:
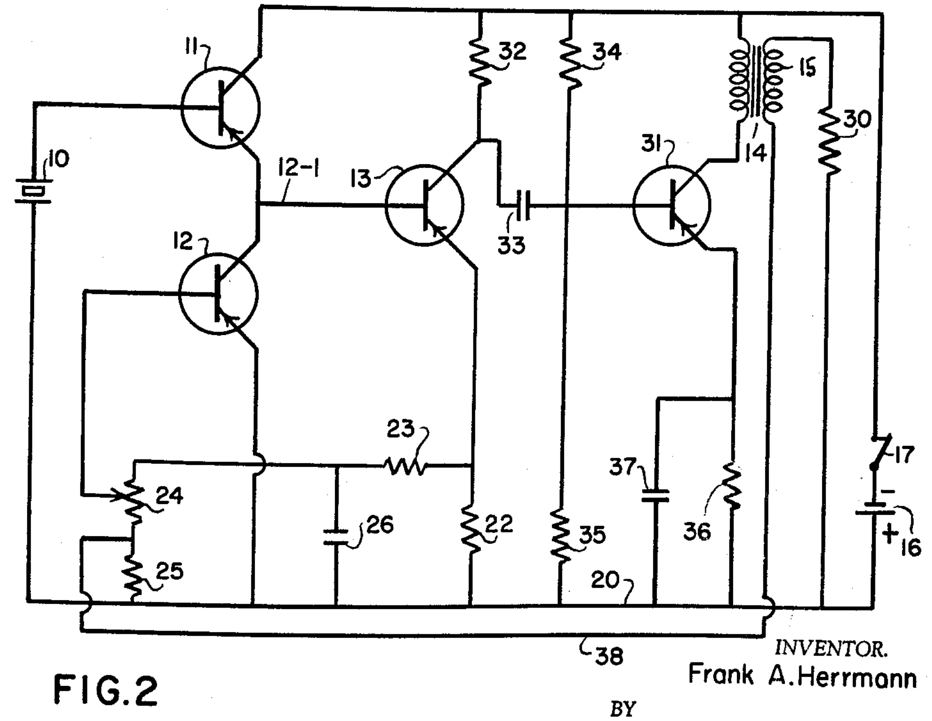
FIG. 2 is a circuit diagram of a high gain transistor amplifier circuit for amplifying the output of a ceramic transducer.

FIG. 2 shows how an amplifier of the type described in connection with FIG. 1, may be provided with additional amplifier stages. The amplifier of FIG. 2 has a ceramic microphone 10, a first-stage transistor 11 with its series transistor 12, a second-stage transistor 13, a direct-current supply 16, switch 17, resistor elements 22, 23, 24, 25, and by-pass capacitor 26, which are identical with and are connected in the same way as corresponding parts of FIG. 1.

The amplifier of FIG. 2 has an additional amplifier stage operating with transistor 31, which is connected in a common emitter configuration. The preceding second-stage transistor 13 has its collector connected through a collector resistance 32 to the direct-current supply lead 21 from the direct-current source 16. The output developed in the collector-emitter circuit of second-stage transistor 13 is impressed on the base of third-stage transistor 31 through a coupling capacitor 33. The proper direct-current bias is applied to the base of transistor 31 by connecting it to an intermediate portion of two voltage-dividing resistances 34, 35, which are connected to opposite-polarity direct-current supply leads 20 and 21. The emitter of third-stage transistor 31 is connected through an emitter resistance 36 to direct-current supply lead 20, the emitter resistance being by-passed by capacitor 37. The collector of third-stage transistor 31 is connected through the primary winding of output transformer 14 to the opposite-polarity direct-current supply lead 21 and delivers the amplified output through the secondary winding 15 of transformer 14 to a load 30 similar to that of FIG. 1. To compensate for the roll-off over the low-frequency and high-frequency response due to transformer-current phase shift, output current of proper amplitude and phase is fed back by a feedback connection from output transformer 14 through a feedback lead connection 28 from the secondary winding 15 of the output transformer 14 to an intermediate point between bias resistance elements 24, 25 which are connected in the input circuit of the first-stage transistor 11. Otherwise, the amplifier of FIG. 2 is identical and operates in the same manner as the amplifier of FIG. 1.

Figure 3:
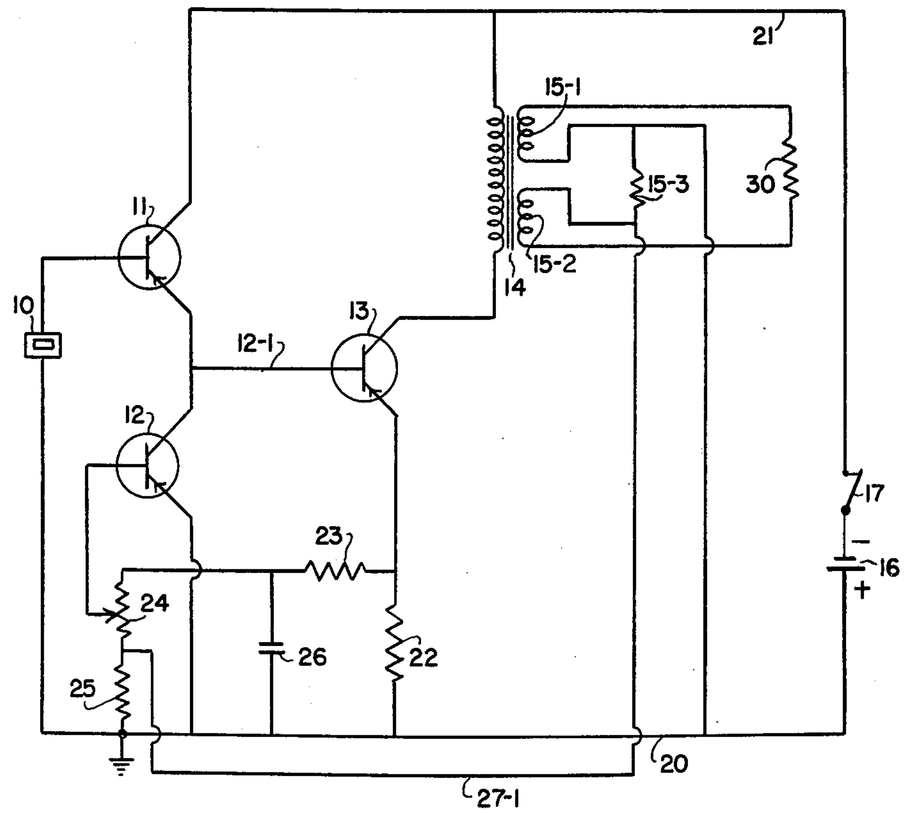
FIG. 3 is a circuit diagram similar to FIG. 1, of a modified circuit exemplifying the invention.

In many applications, it is desired that the feedback circuit from the output side of an amplifier be balanced. FIG. 3 shows, by way of example, how an amplifier of the type described in connection with FIGS. 1 and 2, may be provided with a balanced feedback current circuit from the output transformer. The circuit of FIG. 3 is identical with that of FIG. 1, except that the output transformer has a center-tap secondary winding consisting of two secondary winding sections 15–1, 15–2, having a small center-tap resistance 15–3 connected between its center taps. A part of the secondary current flowing through the center-tap resistance 15–3 is supplied through feedback current lead 27–1 which connects one end of center-tap resistance 15–3 to the input circuit elements 25, 24 of the transistor amplifier 11 of the first amplifier stage, as seen in FIGS. 1 and 2, the feedback circuit being completed by connecting the opposite end of the center-tap resistance 15–3 to the grounded supply lead 20. Such feedback current arrangement may be applied in the same manner in the secondary winding of the output transformer 14 of the amplifier circuit of FIG. 2.

Without thereby limiting its scope, there are given below, by way of example, design data for an amplifier of the type shown in FIG. 2, modified in the manner explained in connection with FIG. 3. The ceramic transducer 10 has 2.5 megohm resistance and a capacity of .0005 micromicrofarad. Transistors 11, 12, 13 and 31 are standard PNP junction resistors. Transistor 11 is type 891; transistor 12 is type 891; transistor 13 is type 891; and transistor 31 is type 892. The battery 16 is of 1.5 volts. Resistance 22 of 1.5 kilo-ohms; resistance 23 of 100 kilo-ohms; resistance 24 of 70 kilo-ohms; resistance 25 of 50 kilo-ohms; resistance 32 of 3.6 kilo-ohms; resistance 34 of 27 kilo-ohms; resistance 35 of 35 kilo-ohms; resistance 36 of 1.5 kilo-ohms; capacitor 26 of 8 microfarads; capacitor 37 of 32 microfarads. The coupling connection between the collector of transistor 13 and the base of transistor 31, is provided by a capacitor 33 of 16 microfarads, and a resistance of 27 kilo-ohms connected parallel thereto. The transformer 14 has a primary winding of 3800 turns, and a secondary winding of 950 turns, divided into two winding sections between the center taps of which is connected a resistance of 15–3 of ½ ohm. The load resistance is 240 ohms.

Figure 4:
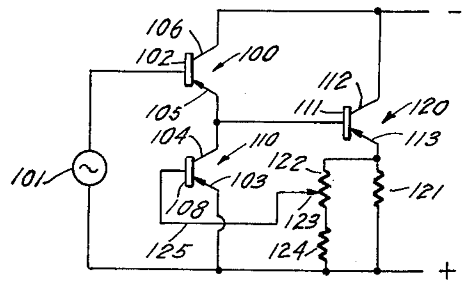
FIG. 4 is a circuit-diagram of an emitter follower circuit constructed in accordance with the teachings of the instant invention and utilizing PNP type transistors.

FIGURE 4 illustrates an emitter follower circuit utilizing PNP transistors and constructed in accordance with the teachings of the instant invention. In this circuit input signal device 101 generates a signal which is impressed between base 102 of input transistor 100 and emitter 103 of auxiliary load transistor 110 connected in series with input transistor 100. Collector 104 of transistor 110 is connected directly to emitter 105 of transistor 100 and also directly to base 111 of output transistor 120. Collector 106 of input transistor 100 and collector 112 of output resistor 120 are both connected directly to the negative terminal of the amplifier power supply while emitter 103 is connected directly to the positive terminal of this power supply.

Emitter 113 of output transistor 120 is connected through resistor 121 to the positive terminal of the power supply. One terminal of potentiometer 122 is connected to emitter 113 while the other end of potentiometer 122 is connected through resistor 124 connected to the positive terminal of the power supply. Jumper 125 connects base 108 of auxiliary transistor 110 directly to the adjustable arm 123 of potentiometer resistor 122 for bias adjustment.

Figure 5:
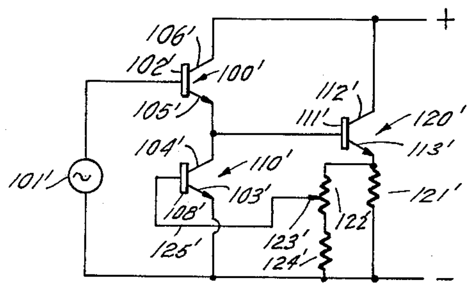
FIG. 5 is a circuit diagram of a circuit similar to that of FIG. 4 in which the transistors are of the NPN type.

FIGURE 5 illustrates an emitter follower circuit constructed as in FIGURE 4 except that all of the transistors are of the NPN type. For the sake of brevity FIGURE 5 will not be described in detail it being sufficient to say that the primed reference numerals of FIGURE 5 refer to elements corresponding to similar elements of FIGURE 4 identified by unprimed reference numerals.

Figure 6:
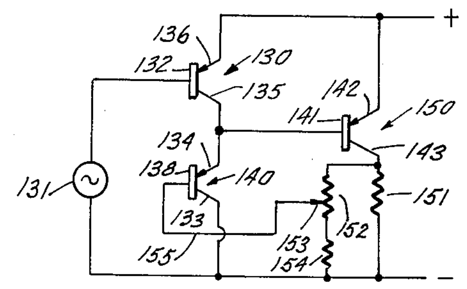
FIG. 6 is a circuit diagram of a circuit of low input impedance constructed in accordance with the teachings of this invention and utilizing PNP type transistors.

FIGURE 6 illustrates another circuit constructed in accordance with the teachings of the instant invention with this circuit having a low input impedance. In the circuit of FIGURE 6 only PNP type transistors are utilized. One terminal of input signal device 131 is connected to base 132 of input transistor 130 while the other terminal of input signal device 131 is connected directly to the negative terminal of the amplifier power supply. Collector 135 of transistor 130 is connected directly to both emitter 134 of auxiliary load transistor 140 and base 141 of output transistor 150.

Collector 133 of series transistor 140 is connected directly to the negative terminal of the power supply while emitter 136 of input transistor 130 is connected directly to the positive terminal of the power supply as is emitter 142 of output transistor 150. Collector 143 of transistor 150 is connected through resistor 151 to the negative terminal of the power supply.

One terminal of potentiometer 152 is connected to collector 143 while the other terminal of potentiometer 152 is connected to one end of resistor 154 whose other end is connected directly to the negative terminal of the power supply. Jumper 155 connects base 138 of series transistor 140 to the adjustable arm 153 of potentiometer 152 for bias adjustment.

Figure 7:
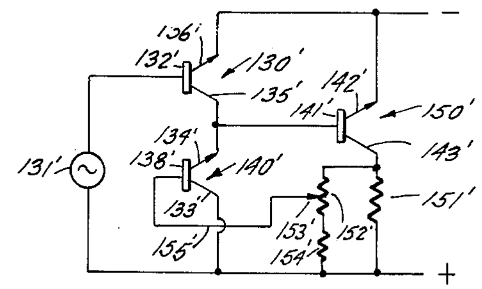
FIG. 7 is a circuit diagram of a circuit similar to that of FIG. 6 in which the transistors are of the NPN type.

FIGURE 7 illustrates a low impedance input circuit constructed in the same manner as the circuit of FIGURE 6 except that all of the transistors are of the NPN type. For the sake of brevity, FIGURE 7 will not be described in detail it being sufficient to say that the primed reference numerals of FIGURE 7 refer to elements corresponding to similar elements of FIGURE 6 identified by unprimed reference numerals.

The features and principles underlying the invention described above in connection with specific exemplifications thereof, will suggest to those skilled in the art many other modifications thereof. It is accordingly desired that the appended claims shall not be limited to any specific features or details shown and described in connection with the exemplifications thereof.

I claim:

1. In a transistor amplifier system for amplifying an input signal from a high-impedance signal device, such as a piezoelectric ceramic microphone, a first, a second and a third junction transistor, each of said three transistors having a base, and two additional unlike electrodes consisting of emitter and collector, each of said three transistors being of the same conductive type, a direct-current supply source and two opposite-polarity supply leads extending from the opposite poles of said source and connected respectively through direct-current circuits to the two unlike electrodes of said third transistor, a direct-current series-circuit including serially the collectors and the emitters of said first and of said second transistor and connected between said opposite-polarity supply leads, the emitter of one transistor and the collector of the other transistor of said first and second transistors having a common direct-current connection to the base of said third transistor, an input circuit from said signal device having one input lead connected to the base of said first transistor and another input lead of opposite polarity connected to the supply lead which is connected to said second transistor for impressing input signals of said device on the circuit serially including the base and one unlike electrode of said first transistor and the two unlike electrodes of said second transistor, a circuit resistance connected between the supply lead to which said opposite-polarity other input lead is connected and an unlike electrode of said third transistor, a direct-current bias circuit including bias resistance elements connected parallel to said circuit resistance, and a direct-current bias connection from a selected portion of said bias resistance elements to the base of said second transistor for maintaining a predetermined relation between the emitter direct currents of said first and second transistors and applying through said common connection a corresponding direct-current bias to the base of said third transistor under variations of ambient temperature.

2. In a transistor amplifier system for amplifying an input signal from a high-impedance signal device, such as a piezoelectric ceramic microphone, a first, a second and a third junction transistor, each of said three transistors having a base, and two additional unlike electrodes consisting of emitter and collector, each of said transistors being of the same conductivity type, a direct-current supply source and two-opposite polarity supply leads extending from the opposite poles of said source and connected respectively through direct-current circuits to the collector and emitter of said third transistor, a direct-current series-circuit including serially the collector and emitter of said first and of said second transistors and connected between said two opposite-polarity supply leads, the emitter of said first transistor and the collector of said second transistor having a common direct-current connection to the base of said third transistor, an input circuit from said signal device having one input lead connected to the base of said first transistor and an opposite polarity other input lead connected to the emitter of said second transistor and the supply lead connected to the emitter of said second transistor for impressing the input signals of said device on the high-impedance circuit serially including the base and emitter of said first transistor and the collector and emitter of said second transistor, an emitter resistance connected between the emitter of said third transistor and the supply lead connected to the emitter of said second transistor, a direct-current bias circuit including bias resistance elements connected parallel to said emitter resistance, and a direct-current bias connection from a selected portion of said bias resistance elements to the base of said second transistor for maintaining a predetermined relation between the emitter direct currents of said first and second transistors and applying through said common connection a corresponding direct-current bias to the base of said third transistor under variations of ambient temperature.

3. In a transistor amplifier as claimed in claim 2, a load, a ferromagnetic-core transformer having a secondary winding connected to said load and a primary winding coupled to the circuit of the emitter and collector of said third transistor for delivering amplified output current thereof through said secondary winding to said load, and a current feedback connection connecting one portion of said secondary transformer winding to said direct-current series circuit of said first and said second transistors for feeding back current flowing through said secondary winding to at least a portion of said series-circuit of said first and second transistors and causing said amplifier to operate with a substantially flat response level over at least a major part of said frequency range between 300 and 15,000 cycles per second.

4. In a transistor amplifier as claimed in claim 2, a load, a ferromagnetic-core transformer having a secondary winding connected to said load and a primary winding coupled to the circuit of the unlike electrodes of said third transistor for delivering amplified output current thereof through said secondary winding to said load, and a current feedback connection from said secondary transformer winding to said direct-current series circuit of said first and said second transistors for feeding back current flowing through said secondary winding to said bias resistance elements and therethrough to a portion of said series circuit extending between the base of said second transistor and said one supply lead for causing said amplifier to operate with a substantially flat response level over at least a major part of the frequency range between 300 and 15,000 cycles per second.

No references cited.